(12) United States Patent
Duineveld et al.

(10) Patent No.: US 6,583,584 B2
(45) Date of Patent: Jun. 24, 2003

(54) ELECTROLUMINESCENT DEVICE AND METHOD FOR MANUFACTURING THEREOF

(75) Inventors: Paulus Cornelis Duineveld, Eindhoven (NL); Coen Theodorus Hubertus Fransiscus Liedenbaum, Eindhoven (NL); Jochem Petrus Maria De Koning, Breda (NL); Ivo Godfried Jozef Camps, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/128,863

(22) Filed: Apr. 24, 2002

(65) Prior Publication Data
US 2003/0011304 A1 Jan. 16, 2003

(30) Foreign Application Priority Data
Apr. 26, 2001 (EP) .............................. 01201520

(51) Int. Cl.$^7$ ................................. G09G 3/10
(52) U.S. Cl. .................... 315/169.3; 313/495
(58) Field of Search ............ 315/169.3, 169.4; 313/495

(56) References Cited

U.S. PATENT DOCUMENTS 5,701,055 A    12/1997   Nagayama et al.
6,356,032 B1 *  3/2002   Suzuki et al. ............ 315/169.3

FOREIGN PATENT DOCUMENTS

EP   0880303   11/1998
EP   0938248    8/1999

* cited by examiner

Primary Examiner—David Vu

(57) ABSTRACT

An electroluminescent device has at least two electroluminescent elements arranged on a substrate in accordance with a desired pattern, each element comprising a first and a second electrode layer and, disposed therebetween, an electroluminescent layer obtained from a liquid layer. A partitioning relief pattern including partitioning ribs of an insulating material protruding from the substrate, forms enclosure areas for containing the liquid layer in accordance with the desired pattern. In order to prevent mixing of liquids between adjacent electroluminescent elements and to allow filling of a maximum amount of liquid in each element, the partitioning element between adjacent elements is comprised of at least two partitioning ribs with an intermediate groove in the area between the partitioning ribs. The invention also refers to a method for manufacturing of an electroluminescent device.

10 Claims, 4 Drawing Sheets

ELECTROLUMINESCENT DEVICE AND METHOD FOR MANUFACTURING THEREOF

The invention relates to an electroluminescent device having at least two electroluminescent elements arranged on a substrate in accordance with a desired pattern, each element comprising a first and a second electrode layer and, disposed therebetween, an electroluminescent layer, the device comprising a partitioning relief pattern including partitioning ribs of an insulating material protruding from the substrate and forming enclosure areas for containing a liquid layer from which the electroluminescent layer is obtainable in accordance with the desired pattern.

The invention also relates to a method for manufacturing of an electroluminescent device having at least two electroluminescent elements, comprising the steps of;

providing a first electrode layer in accordance with a desired pattern on a substrate;

providing a partitioning relief pattern comprising partitioning ribs protruding from the substrate and forming enclosure areas in accordance with a desired pattern;

depositing a liquid layer in the enclosure areas of the partitioning relief pattern;

converting the liquid layer to an electroluminescent layer;

and providing a second electrode layer in accordance with a desired pattern on the electroluminescent layer.

An electroluminescent device according to the present invention can preferably be used as a monochrome or a multi-colour still image display or a matrix display of the passive or active type for displaying of variable still images or movable images.

An electroluminescent device and a method for manufacturing according to the introductory part, is disclosed e.g. in EP 880303, where the electroluminescent layer is obtained through inkjet printing on a substrate. To assist in that the inkjet printed liquid layer for each pixel will be restricted within the boundaries of each pixel, partitioning walls or banks are formed between adjacent pixels. This is advantageous especially in displays containing two or more colours to prevent mixing of the liquid for respective luminescent colour between adjacent pixels, and in this way it is possible to improve the contrast and brightness of the displayed image.

However, with a device and a method according to EP 880303, it is a clear risk that the electroluminescent liquid from one pixel will spill over and mix with the electroluminescent liquid in an adjacent pixel, which may be of different kind in order to display for instance different colours, if the pixels are filled with too large amounts of electroluminescent liquid.

For manufacturing reasons it is also advantageous to keep the partitioning ribs as low as possible but at the same time make the liquid layer with a sufficient layer thickness, due to poor concentration of active luminescent substance in the liquid, which often has not more than about 1% active substance. Hence, during the converting process through e.g. drying or gelling of the liquid layer, the remaining electroluminescent layer will be considerable reduced, typically in the order of one hundred times thinner than the liquid layer. Consequently it is desirable to fill the pixels with as much liquid as possible. This is discussed further in application EP 00/11706.

Moreover, during the manufacturing process, it is favourable to use inkjet printing devices or the like, with a multi nozzle head instead of a single nozzle head. In a multi nozzle head it is not possible to get exactly the same output of liquid from each nozzle but a variation of approximately 5–10% might normally be expected in the case of an inkjet printing device. If the inkjet head is tuned in such a way that the desired layer thickness is reached even with the nozzle with the lowest output quantity, it is a clear risk that the electroluminescent elements filled by the nozzles with the highest output quantity will spill over the partitioning ribs and the liquids in adjacent electroluminescent elements will mix.

It is an object of the invention to provide an electroluminescent device where the risk of mixing of the liquid layers between adjacent electroluminescent elements is reduced and, consequently, the electroluminescent elements may be provided with a thicker and more uniform electroluminescent layer and the performance of employing multi nozzle heads during manufacturing is improved. At least these objects are achieved with an electroluminescent device, according to the preamble, which is characterized in that a partitioning relief element separating adjacent electroluminescent elements comprises at least two partitioning ribs with an intermediate groove in the area between the partitioning ribs.

The invention also relates to a method of manufacturing of an electroluminescent device with essentially the same objects as for the electroluminescent device mentioned above. At least these objects are achieved through a method according to claim 6.

The invention is based on the insight that the above mentioned objects are achieved with an electroluminescent device and a method for manufacturing, where each electroluminescent element or pixel is provided with a separate partitioning rib which is not common for two adjacent pixels in the area between them. Instead there are at least two partitioning banks or ribs between adjacent pixels with a groove between the partitioning ribs of the respective adjacent pixels.

One requirement for an electroluminescent layer to emit light is that the electroluminescent layer is disposed between two electrodes, one cathode and one anode. Accordingly, in a preferred embodiment the partitioning groove between two adjacent pixels has not more than one electrode so that any electroluminescent liquid spilled over from one of the pixels into the groove, will not be energised and emit light with a disturbing effect on the image generated by the display.

The present invention is both suited for monochrome and for colour displays. For both types the invention will facilitate forming of a uniform electroluminescent layer. For colour displays is a further advantage that the invention will help to prevent mixing of different colours. A still further advantage is that with a method according to the invention it is possible to print more than one colour next to each other with a single printer, before drying of the colours and also at same time in one process.

There are various ways of arranging the electrodes and electroluminescent layers in a display. If for example the device is intended for simple illumination or displaying of a not variable, still picture image, both the anode and cathode may be common to the entire device, i.e. be applied in one continuous electrically conductive layer on respective sides of the electroluminescent layer. On the other hand, if the device is intended to display variable or moving pictures, each pixel need to be independently addressable. This can be achieved in basically two different ways.

Firstly the electrodes can be arranged in columns and rows, for instance are the anodes electrically connected in rows, whereas the cathodes are electrically connected in columns perpendicular to the anodes. This is called a passive matrix display and energising of a pixel is effected in the intersection of a voltage-fed anode row and a likewise voltage-fed cathode column. Normally, imaging is carried out through sequentially voltage feeding of the anode rows and simultaneous voltage feeding of the cathode columns whose intersections with the anode rows is desired to emit light. Accordingly the pixels will be energised intermittently.

Secondly the pixels can be individually and independently addressable, e.g. by controlling each pixel by means of a thin film transistor. This is called an active matrix display and in this way the pixels can, when desired, be energised continuously with a brighter image as a result.

In a preferred embodiment of the invention, the electroluminescent device is formed on a suitable substrate, of for instance transparent synthetic resin, quartz, ceramics or glass. The first electrode, preferably the anode, is applied in a thin layer on the substrate in the desired pattern and is preferably of a metal alloy, such as indiumtinoxide (ITO), which is applied through a vacuum deposition of metal vapour. Thereafter the relief pattern is applied by e.g. a photolithographic method. Subsequently the electroluminescent liquid layer is selectively applied in the enclosure areas formed by the relief pattern in any suitable way, like for instance by inkjet printing or dispensing of any organic as well as inorganic electroluminescent liquid. Finally the liquid layer is converted into an electroluminescent layer, e.g. by a drying or gelling process, and the outer electrode, preferably the cathode, is applied by e.g. vacuum deposition of a suitable metal vapour. It is to be understood that several other layers and additives could be incorporated in the electroluminiscent device in addition to the above mentioned. Examples of such is hole-injecting and/or -transport layers, electron-injecting and/or -transport layers, wetting agents, levelling agents, protective layers and the like.

The electroluminescent layer can be made of a substantially organic, electroluminescent material. Suitable such materials include organic photo- or electroluminescent, fluorescent and phosphorescent compounds of low or high molecular weight. Preferred are materials including electroluminescent polymers having a substantially conjugated backbone (main chain), such as polythiophenes, polyphenylenes, polythiophenevinylenes, or, more preferably, poly-p-phenylenevinylenes. Particularly preferred are (blue-emitting) poly(alkyl)fluorenes and poly-p-phenylenevinylenes which emit red, yellow or green light and are 2-, or 2,5-substituted poly-p-phenylenevinylenes, in particular those having solubility-improving side groups at the 2- and/or 2,5 position such as $C_1$–$C_{20}$, preferably $C_4$–$C_{10}$, alkyl or alkoxy groups. Preferred side groups are methyl, methoxy, 3,7-dimethyloctyloxy, and 2-methylpropoxy. More particularly preferred are polymers including a 2-phenyl-1,4-phenylenevinylene repeating unit, the phenyl group being optionally substituted with alkyl and/or alkoxy groups of the type above, in particular methyl, methoxy, 3,7-dimethyloctyloxy, or, better still, 2-methylpropoxy. The organic material may contain one or more of such compounds.

In the context of the invention, the term organic includes polymeric whereas the term polymer and affixes derived therefrom, includes homopolymer, copolymer, terpolymer and higher homologues as well as oligomer.

Optionally the organic electroluminescent material contains further substances, organic or inorganic in nature, which may be homogeneously distributed on a molecular scale or present in the form of a particle distribution. In particular, compounds improving the charge-injecting and/or charge-transport capability of electrons and/or holes, compounds to improve and/or modify the intensity or colour of the light emitted, stabilizers, and the like may be present.

The hole-injecting electrode is suitably made of a metal (alloy) having a high work function such as Au, Pt, Ag. Preferably, a more transparent hole-injecting electrode material, such as an indiumtionxide (ITO), is used. Conductive polymers such as a polyaniline (PANI) and a poly-3,4-ethylenedioxythiophene (PEDOT) are also suitable transparent hole-injecting electrode materials. Preferably, a PANI layer has a thickness of 50 to 200 nm, and a PEDOT layer 100 to 300 nm. If an ITO hole-injecting electrode is used, the first electrode is preferably the hole-injecting electrode.

The mutual interaction of the relief pattern and the fluid layer determines the thickness profile of the electroluminescent layer. An important parameter which can be used to adapt the mutual interaction is the wettability of the fluid layer with respect to the surface of the relief pattern. The wettability is determined by the extent to which the relief pattern surface is hydrophobic or hydrophilic with respect to the fluid layer. The wettability of the fluid can be adapted by conventional means such as means for changing the viscosity, contact angle or visco-elasticity of the fluid layer or by adding surfactants or other agents which affect the Theological and interfacial properties of the fluid layer. The wettability of the relief pattern can be modified by selecting a different relief material or by subjecting a relief pattern to a surface treatment such as an UV/ozone treatment. If the wettability of the fluid with respect to the relief pattern is selected such that the surface of the fluid layer adopts a substantially planar meniscus, the electroluminescent layer is substantially uniform in thickness in the sense defined above.

In the case of an electroluminescent device where the pixels are to be individually addressable, such as a passive or an active matrix display, at least one of the electrode layers has to be patterned in a non-conductive way between adjacent pattern areas.

In an active matrix display it is sufficient if one of the electrodes is patterned. Each pixel electrode of the patterned electrode can be individually patterned and electrically insulated from the remaining pixel electrodes, and connected to and controlled by a control means like a thin film transistor as well. In a preferred embodiment the electrode closest to the substrate, preferably the anode, is patterned whereas the outer electrode, the cathode is coated over essentially the entire surface of the display.

In a passive matrix display both of the electrodes has to be patterned, one in rows of pixel electrodes and the other in columns of pixel electrodes perpendicular to the rows. The patterning of the outer electrode, preferably the cathode layer, may be accomplished by providing an auxiliary relief pattern having a roof-like structure with an overhanging section in profile, so that when the electrode material is deposited on the display, the overhanging sections of the relief pattern will shadow out areas on the display and prevent electric contact between the electrode areas in question.

In a preferred embodiment of the invention, the pixels are square or rectangular formed and, accordingly the partitioning ribs of each pixel are linear and parallel and forming a linear groove between each pixel. However, it is also possible to have pixels with other shapes, such as circular, in which case the partitioning ribs and the grooves between them need not to be linear. An example of this is disclosed in an alternative embodiment hereinafter.

The grooves between adjacent pixels and partitioning ribs are advantageously made as deep and narrow as possible. In that way it may accommodate a relatively huge amount of possibly spilled over liquid but at the same time it represents a small none light-emitting area of the display.

For the state of the art, reference also is made to U.S. Pat. No. 5,701,055 and the corresponding EP 938248. In those documents is disclosed display elements with double barrier elements between pixels. However, those documents are concerned with a display element having an electroluminescent layer which is evaporated onto the substrate and not applied in form of a liquid as in the present invention. Hence, the problems solved and the advantages attained is completely different from this invention.

These and other aspects of the invention will be apparent from and elucidated with reference to the embodiments described hereinafter.

The invention will now be explained by way of example with reference to the accompanying, diagrammatic drawings in which.

Figure 8:
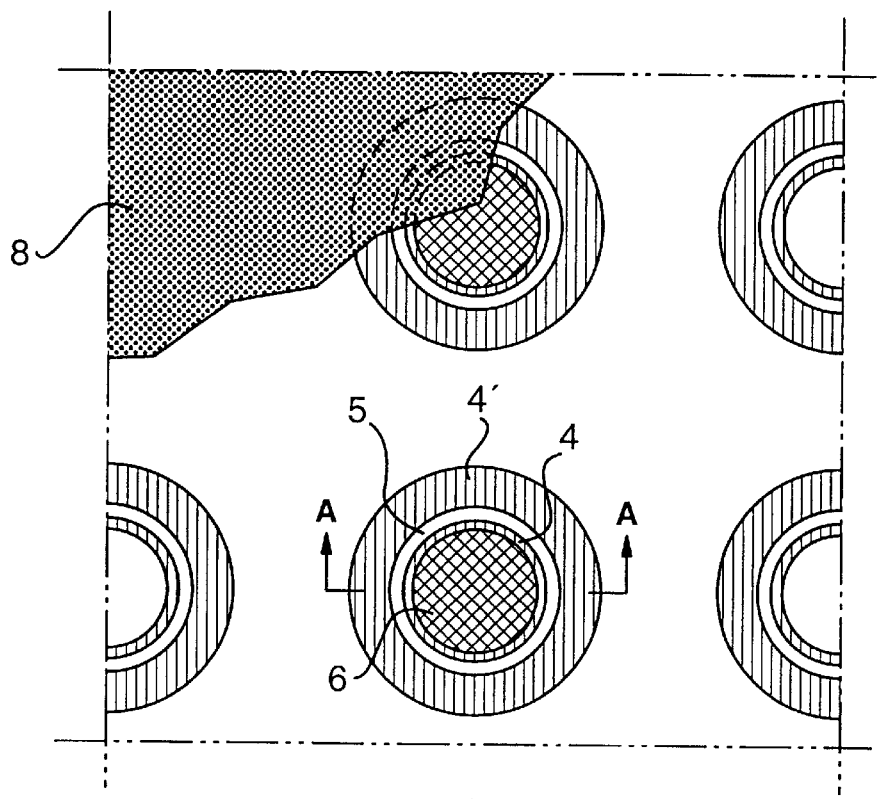
FIG. 8 is a partly cut away plan view of a portion of an active matrix display according to a fourth embodiment of the invention.
Figure 9:
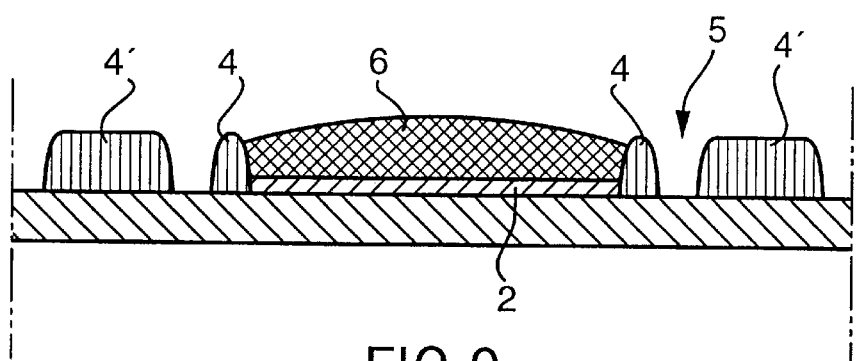
Figure 10:
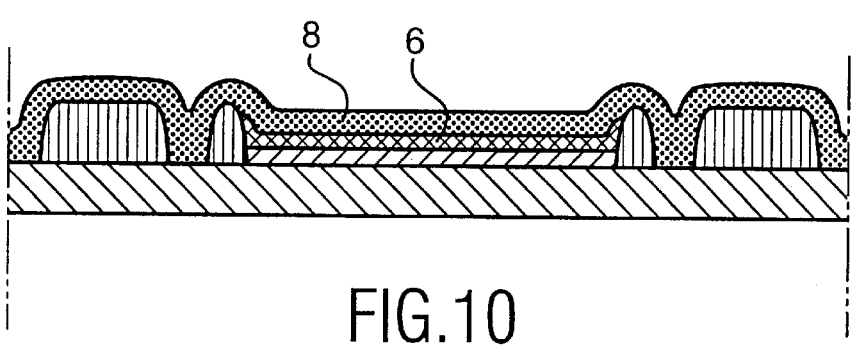

FIG. 9 is a cross-sectional view of the display taken along line A—A in FIG. 8 after each pixel has been filled with an electroluminescent layer but before converting the liquid layer into an electroluminescent layer; and FIG. 10 is a cross-sectional view similar to FIG. 9 but taken after converting the liquid layer into an electroluminescent layer and applying an electrode layer over the outer surface of the electroluminescent device.

Figure 1:
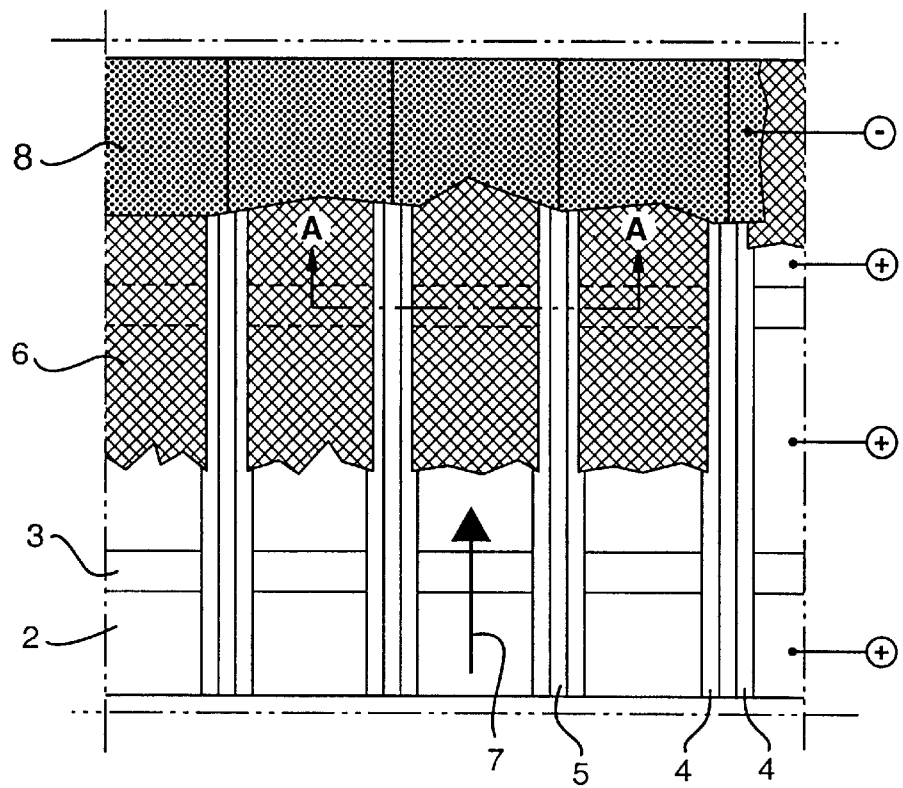
FIG. 1 is a partly cut away plan view of a portion of an active matrix display according to a first embodiment of the invention.
Figure 2:
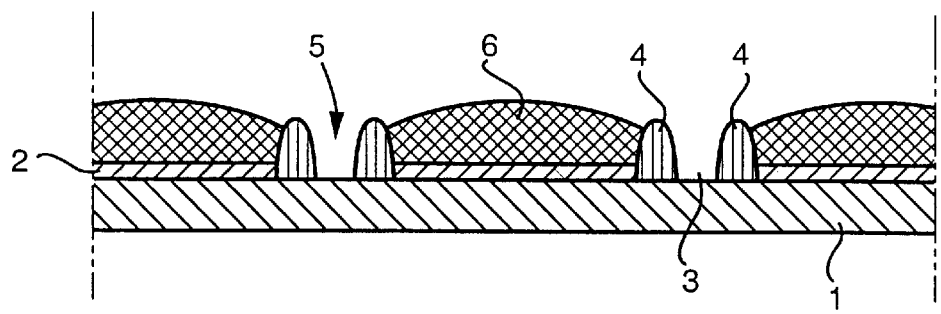
FIG. 2 is a cross-sectional view of the display taken along line A—A in FIG. 1 after each pixel has been filled with an electroluminescent liquid layer but before converting the liquid layer into an electroluminescent layer.
Figure 3:
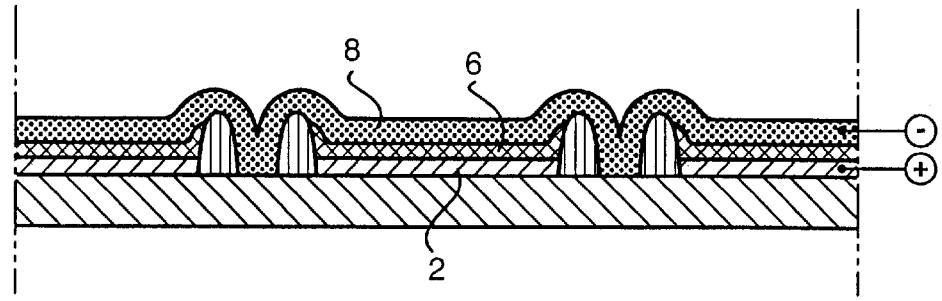
FIG. 3 is a cross-sectional view similar to FIG. 2 but taken after converting the liquid layer to an electroluminescent layer and applying an electrode layer over the outer surface of the electroluminescent device.

Referring first to FIGS. 1–3, a first embodiment of the invention is diagrammatic illustrated in a plan view and two cross-sectional views. This embodiment refers to an active matrix display and comprises a substrate 1, on which an anode layer 2 is deposited in a pattern of individually defined rectangles, which are electrically insulated from each other and forming part of different, separate pixels. A separate thin film transistor (not shown on the drawings) controls each anode, which makes it possible to energise each anode individually. The rectangular anodes are arranged in rows and columns with intervals 3 therebetween. In the intervals between the anode columns are partitioning elements in the form of partitioning ribs 4 arranged on both sides of each anode column so that the partitioning ribs 4 between two adjacent anode columns form a pair of partitioning ribs with a groove 5 defined therebetween.

After forming of the relief pattern, the enclosure areas formed between the partitioning ribs on each side of the anode columns are filled, preferably through inkjet printing, with an electroluminescent liquid 6. The printing is performed in the direction of arrow 7 in FIG. 1, i.e. in a direction parallel with the partitioning ribs 4. Adjacent enclosure areas are suitably filled with electroluminescent liquids having capability of emitting light of different colours, such as blue, red and green for displaying full colour images.

Subsequently the electroluminescent device is subjected to e.g. a drying or gelling process, converting the electroluminescent layer from a liquid phase to a solid or gel phase. During the converting process the electroluminescent layer reduces and becomes much thinner. This is illustrated in FIG. 3 in a schematic representation not in true scale, for sake of clarity, since commonly employed electroluminescent liquids typically have a concentration of about 1% active electroluminescent substance and hence, after the converting process, the resulting electroluminescent layer 6 will have a thickness of approximately 1% of the electroluminescent liquid layer. In FIG. 3 is also shown a cathode layer 8 which is coated, preferably through a vacuum deposition of metal vapour, over the entire surface of the display.

The invention makes it thus possible to fill the enclosure area between two partitioning ribs with a maximum amount of electroluminescent liquid. If the liquid unintentional should spill over one of the partitioning ribs, it will accumulate in the groove 5 between the enclosure areas without disturbing the function or performance of the display since it will not mix with the liquid in the adjacent enclosure area. Neither will the possible spilled over liquid in the grooves be able to be energised and disturb the appearance of the display by emitting light since the groove areas comprise only one electrode layer, namely the outer cathode layer 8.

In the embodiment according to FIGS. 1–3 it would also be possible to provide the electroluminescent device with partitioning ribs also in a direction perpendicular to the ribs shown in the drawing. The combined partitioning ribs would then define rectangular enclosure areas.

Figure 4:
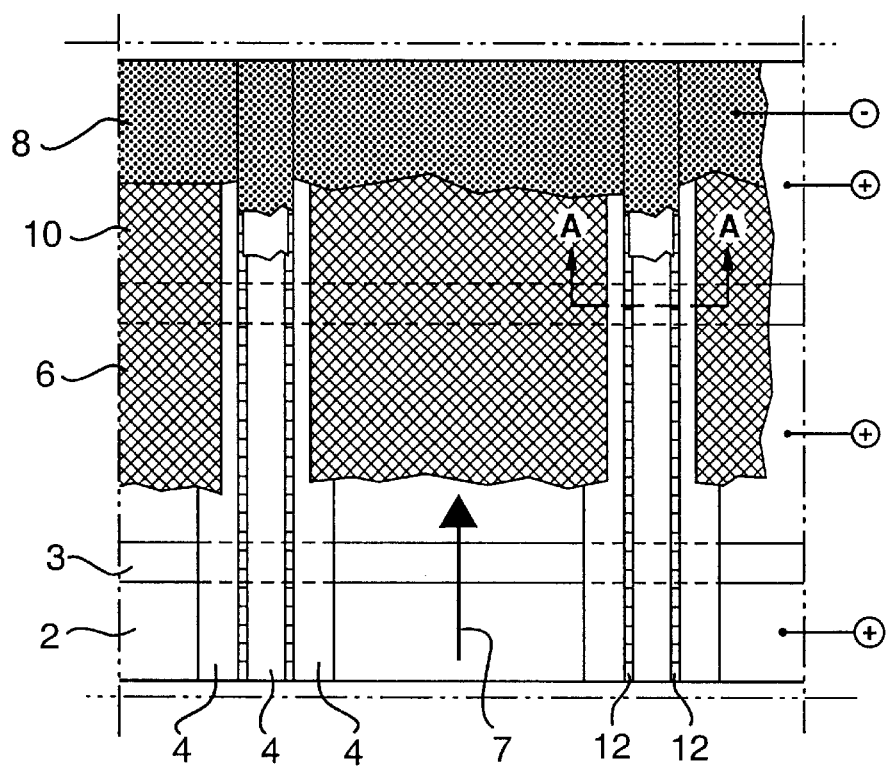
FIG. 4 is a partly cut away plan view of a portion of a passive matrix display according to a second embodiment of the invention.
Figure 5:
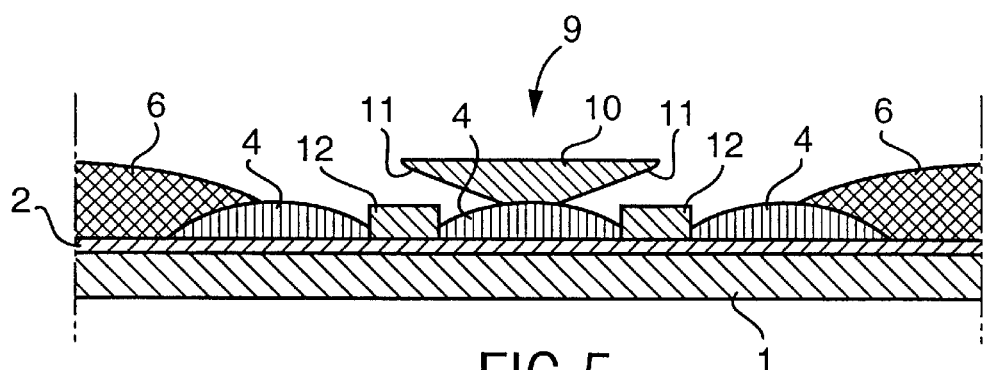
FIG. 5 is a cross-sectional view of the display taken along line A—A in FIG. 4 after each pixel has been filled with an electroluminescent liquid layer but before converting the liquid layer into an electroluminescent layer.
Figure 6:
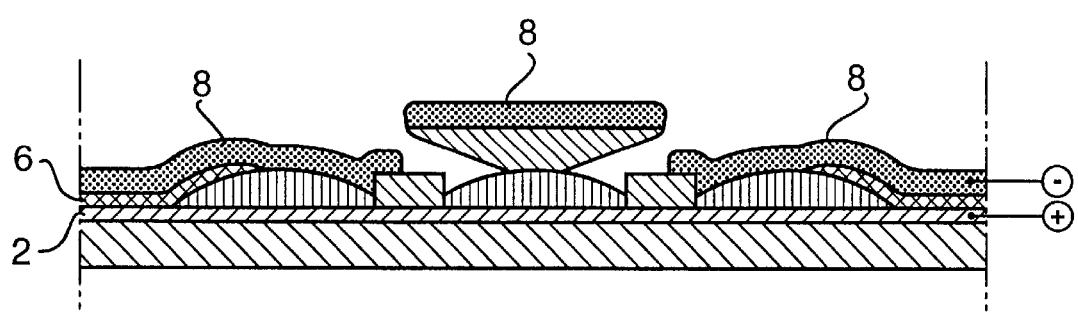
FIG. 6 is a cross-sectional view similar to FIG. 5 but taken after converting the liquid layer to an electroluminescent layer and applying an electrode layer over the outer surface of the electroluminescent device.

A second embodiment of the invention is illustrated in FIGS. 4–6. This embodiment is of a passive type of matrix display. Unlike the preceding embodiment, the anode 2 is in the form of continuous rows with electric insulating gaps 3 between each row, which are intersected at right angles by, generally with 9 denoted, partitioning elements. These partitioning elements have a substantial different shape in cross-section in comparison with the first embodiment, as is apparent from FIGS. 5 and 6. Instead of two partitioning ribs there are three partitioning ribs 4 with relatively wide and low shape. On top of the middle one of these partitioning ribs, is an auxiliary partitioning or shadowing rib 10 arranged, which in cross-section is wedge or mushroom shaped with overhanging sections 11 on each side.

Depositing of the electroluminescent layer 6, preferably by inkjet printing, is carried out in the direction of arrow 7, i.e. in a direction parallel with the partitioning relief elements 9 in the enclosure areas defined therebetween. Finally, after converting the electroluminescent layer from a liquid state to solid state, as is shown in FIG. 6, the entire surface of the display is covered by a cathode layer 8, preferably through vacuum deposition of metal vapour. The overhanging sections 11 of the shadowing rib 10 has the effect that the surfaces beneath the overhanging sections are overshadowed and accordingly no cathode material is deposited on those surfaces. Consequently, there will be no electrical connection between the cathode layers on both sides of a partitioning relief element 9 with the result that the cathode layer become divided into electrically insulated cathode columns perpendicular to the anode rows 2. As is apparent from FIGS. 5 and 6, there is an auxiliary resist rib 12 arranged in the area between each partitioning rib 9. Their function is to prevent direct contact, and thereby prevent short-circuiting, between the cathode and the anode. This could happen if no electroluminescent liquid 6 has spilled over the outer partitioning rib 4 and is possible since the layer of anode rows are continuously extended under the partitioning elements 9.

Preferably are the partitioning elements 9 with the partitioning ribs 4, the shadowing ribs 10 and the resist ribs 12, manufactured through a suitably photolithographic method commonly known in the art. The material of the ribs can be both an anorganic as well as an organic material.

Figure 7:
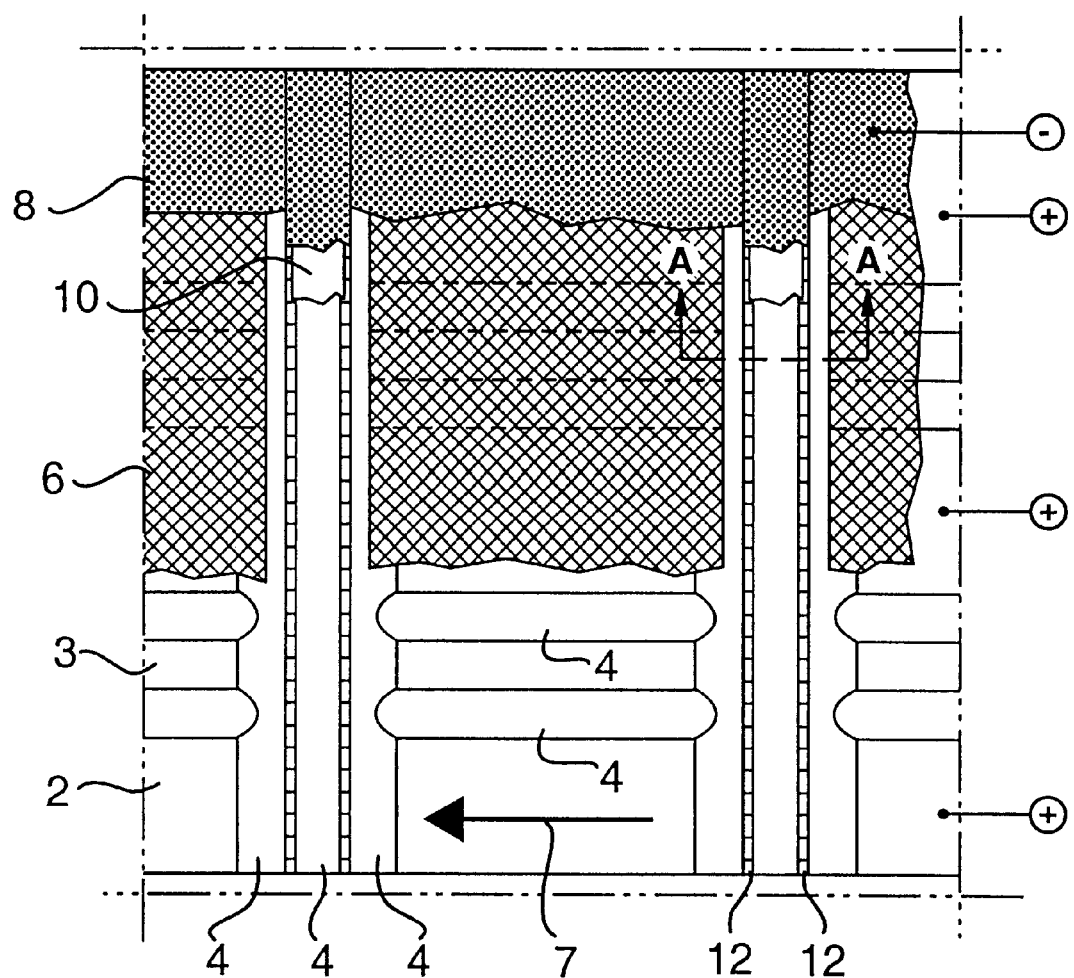
FIG. 7 is a partly cut away plan view of a passive matrix display according to a third embodiment of the invention.

In FIG. 7 is illustrated another embodiment of a passive matrix display with the anodes arranged in rows, electrically separated by a pair of partitioning ribs 4 similar to the ones in the embodiment according to FIGS. 1–3, and the cathodes arranged in columns, electrically separated by partitioning elements 9 similar to the ones in the embodiment according to FIGS. 4–6.

The anode rows are parallel with the pair of partitioning ribs 4 and also parallel with the printing direction, as indicated by arrow 7, of the electroluminescent liquid 6. Accordingly, the electroluminescent layer 6 will normally be printed only in the enclosure areas defined between two pairs of partitioning ribs and only as an exception in the groove 5 between two adjacent partitioning ribs 4, for example when the electroluminescent liquid spills over the ribs 4.

The cathode columns are restricted by the partitioning elements 9 in a similar way as in the embodiment according to FIGS. 4–6, i.e. the partitioning element comprises three partitioning ribs 4 with relatively wide and low shape. On top of the middle one of these partitioning ribs is an auxiliary partitioning or shadowing rib 10 arranged, which in cross-section is wedge or mushroom shaped with overhanging sections 11 on each side. However, though it would be possible, the printing of the electroluminescent liquid will in this embodiment not be performed in a continuous way, as in the first and second embodiment, but in a way called "drop on demand". I.e. when printing in the direction of arrow 7 the printing starts after passing one partitioning element 9 and stops when reaching the subsequent partitioning element. Seen in cross-section according to A—A in FIG. 7, it will look like the cross-section in FIG. 5 after filling the pixels with electroluminiscent liquid and as in FIG. 6 after the converting process and the covering of the display with a cathode layer. When covering the surface of the display with the cathode layer material, the overhanging sections 11 of the shadowing rib 10 has the effect that the surfaces beneath the overhanging sections are overshadowed and accordingly no cathode material is deposited on those surfaces. Consequently, there will be no electrical connection between the cathode layers on both sides of a partitioning relief element 9 with the result that the cathode layer become divided into electrically insulated cathode columns perpendicular to the anode rows 2. Auxiliary resist ribs 12 are provided between adjacent partitioning ribs 4 and the risk for the anode and the cathode layer to come into contact and cause short-circuiting is thereby eliminated.

In FIGS. 8–10 is shown a fourth embodiment of the invention in which the pixels have a circular shape seen in plan view. A circular anode layer 2 is arranged on the substrate 1 for each pixel. The anode layer is surrounded by a first, inner partitioning rib 4, and with a gap or groove 5 from the first partitioning rib there is arranged a second, outer partitioning rib 4'. Each pixel is thereafter filled with an electroluminiscent liquid layer 6 according to FIG. 9, preferably with the "drop on demand" method, and after a converting process as previously described, the display is covered by a cathode layer 8 according to FIG. 10. An electroluminescent element arranged in this way is preferably of an active matrix type with a thin film transistor controlling each pixel.

It is to be understood that the partitioning elements according to the invention could be built up and shaped in many different ways within the scope of the claims. E.g. can the number and shape of the partitioning ribs vary. To achieve the technical effect and advantages to prevent mixing of electroluminescent liquid in case of spilling over the partitioning ribs, it is only of importance that there are at least two partitioning ribs between adjacent pixels with a groove between them.

What is claimed is:

1. An electroluminescent device having at least two electroluminescent elements arranged on a substrate in accordance with a desired pattern, each element comprising a first and a second electrode layer and, disposed therebetween, an electroluminescent layer, the device comprising a partitioning relief pattern including partitioning ribs of an insulating material protruding from the substrate and forming enclosure areas for containing a liquid layer from which the electroluminescent layer is obtainable in accordance with the desired pattern, wherein a partitioning relief element separating adjacent electroluminescent elements comprises at least two partitioning ribs with an intermediate groove in the area between the partitioning ribs.

2. An electroluminescent device as claimed in claim 1, wherein not more than one electrode layer is provided in the groove in the area between two partitioning ribs in a pair of ribs.

3. An electroluminescent device as claimed in claim 2, wherein the partitioning element comprises a shadowing rib with overhanging sections.

4. An electroluminescent device as claimed in claim 3, wherein the shadowing rib is arranged on one of the partitioning ribs.

5. An electroluminescent device as claimed in claim 4, wherein the partitioning element comprises three partitioning ribs, whereas the shadowing rib is arranged on the middle partitioning rib.

6. A method of manufacturing an electroluminescent device having at least two electroluminescent elements, comprising the steps of:

providing a first electrode layer in accordance with a desired pattern on a substrate;

providing a partitioning relief pattern comprising partitioning ribs protruding from the substrate and forming enclosure areas in accordance with a desired pattern for containing a liquid layer from which an electroluminescent layer is obtainable;

depositing a liquid layer in the enclosure areas of the partitioning relief pattern;

converting the liquid layer to an electroluminescent layer; and providing a second electrode layer in accordance with a desired pattern on the electroluminescent layer;

wherein a partitioning element between adjacent electroluminescent elements is formed with at least two partitioning ribs with an intermediate groove.

7. A method as claimed in claim 6, including the further step of providing not more than one electrode layer in the area of the groove between two adjacent partitioning ribs of a pair of ribs.

8. A method as claimed in claim 7, including the further step of forming the partitioning element with a shadowing rib comprising overhanging sections.

9. A method as claimed in claim 8, including the further step of arranging the shadowing rib on one of the partitioning ribs.

10. A method as claimed in claim 9, including the further step of forming the partitioning element with at least three partitioning ribs and arranging the shadowing rib on the middle partitioning rib.

* * * * *